(12) United States Patent
Batson et al.

(10) Patent No.: US 7,969,465 B2
(45) Date of Patent: Jun. 28, 2011

(54) METHOD AND APPARATUS FOR SUBSTRATE IMAGING

(75) Inventors: Don T. Batson, Austin, TX (US); Reginald Hunter, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 1170 days.

(21) Appl. No.: 11/612,717

(22) Filed: Dec. 19, 2006

(65) Prior Publication Data

US 2007/0085905 A1    Apr. 19, 2007

Related U.S. Application Data

(63) Continuation of application No. 09/886,307, filed on Jun. 19, 2001, now abandoned.

(51) Int. Cl.
*H04N 7/18* (2006.01)
(52) U.S. Cl. .......................................... 348/87; 348/126
(58) Field of Classification Search .............. 348/86–92, 348/125–131
See application file for complete search history.

(56) References Cited

U.S. PATENT DOCUMENTS

| | | | |
|---|---|---|---|
| 4,441,124 A | 4/1984 | Heebner et al. |
| 4,449,818 A | 5/1984 | Yamaguchi et al. |
| 4,499,595 A | 2/1985 | Masaitis et al. |
| 4,772,126 A | 9/1988 | Allemand et al. |
| 4,893,932 A | 1/1990 | Knollenberg |
| 4,898,471 A | 2/1990 | Vaught et al. |
| 4,920,385 A | 4/1990 | Clarke et al. |
| 4,941,980 A | 7/1990 | Halavee et al. |
| 4,969,748 A | 11/1990 | Crowley et al. |
| 5,058,178 A | 10/1991 | Ray |
| 5,120,034 A | 6/1992 | VanEngelen et al. |
| 5,177,559 A | 1/1993 | Batchelder et al. |
| 5,233,191 A | 8/1993 | Noguchi et al. |
| 5,274,434 A | 12/1993 | Morioka et al. |
| 5,305,391 A | 4/1994 | Gomibuchi |
| 5,416,594 A | 5/1995 | Gross et al. |
| 5,463,459 A | 10/1995 | Morioka et al. |
| 5,465,152 A | 11/1995 | Bilodeau et al. |

(Continued)

FOREIGN PATENT DOCUMENTS

EP    0 638 801 A    2/1995

(Continued)

OTHER PUBLICATIONS

U.S. Appl. No. 09/173,669, *Detection of Wafer Fragments in a Wafer Processing Apparatus*, filed Oct. 15, 1998.

*Primary Examiner* — Andy S Rao
(74) *Attorney, Agent, or Firm* — Patterson & Sheridan, L.L.P.

(57) ABSTRACT

The invention provides a substrate surface imaging method and apparatus that compensates for non-linear movement of the substrate surface during an imaging sequence. In one aspect of the invention, the imaging method and apparatus compensate for the non-linear substrate surface movement by adjusting the image receiver trigger points to correspond to image positions on the substrate surface. In another aspect, the invention provides synchronous imaging where the distance between each image position is determined by counting the number of stepper motor steps between image positions. In still another aspect, the invention provides for asynchronous substrate imaging by determining an image trigger time between each image position and using the image trigger time to trigger the receiver at the appropriate time to accurately image the substrate surface.

23 Claims, 15 Drawing Sheets

U.S. PATENT DOCUMENTS

| | | |
|---|---|---|
| 5,479,252 A | 12/1995 | Worster et al. |
| 5,483,138 A | 1/1996 | Shmookler et al. |
| 5,486,919 A | 1/1996 | Tsuji et al. |
| 5,563,798 A | 10/1996 | Berken et al. |
| 5,637,881 A | 6/1997 | Burghard et al. |
| 5,644,393 A | 7/1997 | Nakamura et al. |
| 5,659,172 A | 8/1997 | Wagner et al. |
| 5,663,569 A | 9/1997 | Hayano |
| 5,694,214 A | 12/1997 | Watanabe et al. |
| 5,699,447 A | 12/1997 | Alumot et al. |
| 5,737,072 A | 4/1998 | Emery et al. |
| 5,748,305 A | 5/1998 | Shimono et al. |
| 5,774,222 A | 6/1998 | Maeda et al. |
| 5,781,230 A | 7/1998 | Nguyen et al. |
| 5,797,317 A | 8/1998 | Lahat et al. |
| 5,801,824 A | 9/1998 | Henley |
| 5,805,278 A | 9/1998 | Danko |
| 5,818,576 A | 10/1998 | Morishige et al. |
| 5,822,213 A | 10/1998 | Huynh |
| 5,834,758 A | 11/1998 | Trulson et al. |
| 5,861,952 A | 1/1999 | Tsuji et al. |
| 5,883,710 A | 3/1999 | Nikoonahad et al. |
| 5,889,593 A | 3/1999 | Bareket |
| 5,903,342 A | 5/1999 | Yatsugake et al. |
| 5,909,276 A | 6/1999 | Kinney et al. |
| 5,940,175 A | 8/1999 | Sun |
| 6,360,005 B1 * | 3/2002 | Aloni et al. .......... 382/148 |
| 6,707,544 B1 | 3/2004 | Tsadka et al. |
| 6,813,032 B1 | 11/2004 | Hunter et al. |
| 2003/0199097 A1 | 10/2003 | Suzuki et al. |

FOREIGN PATENT DOCUMENTS

| | | |
|---|---|---|
| WO | 99/00661 | 1/1999 |
| WO | WO 99/56113 | 11/1999 |

* cited by examiner

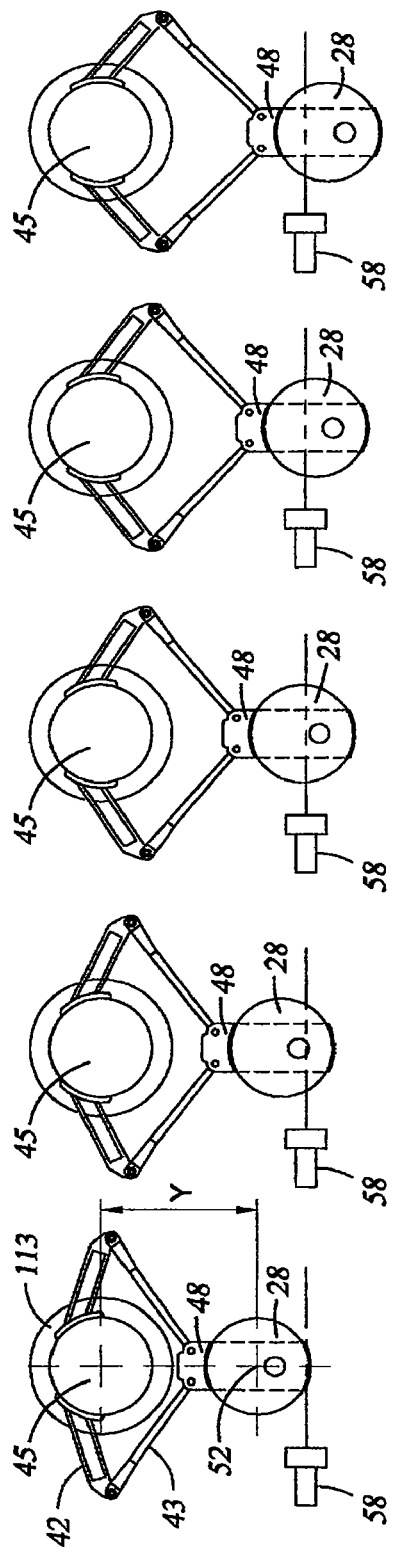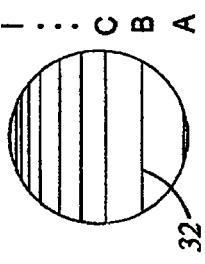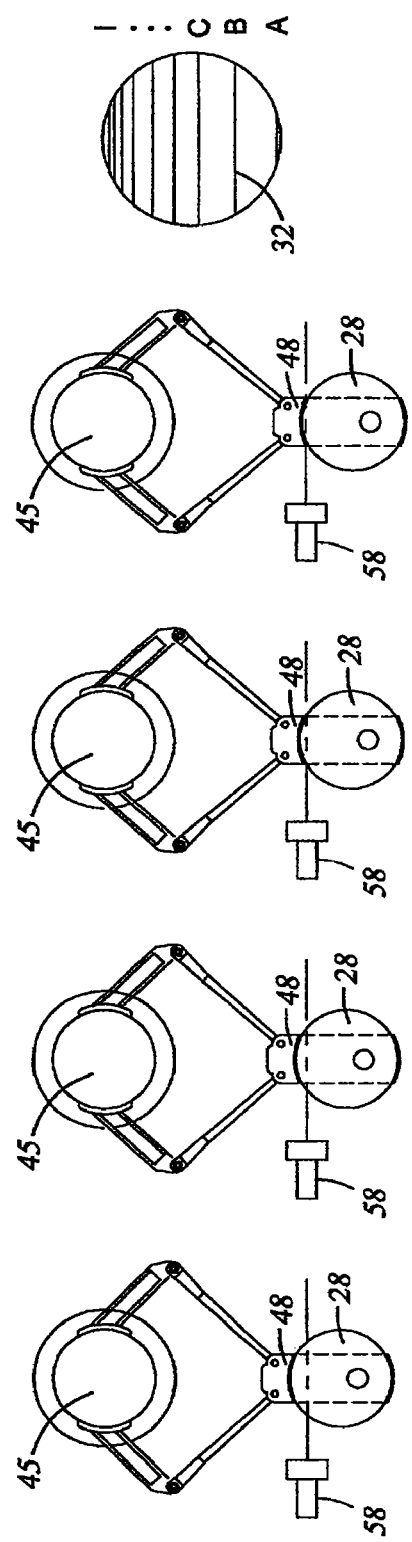

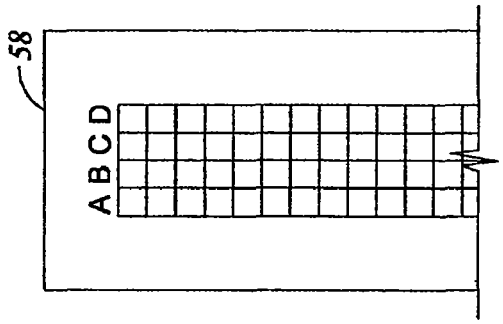
Fig. 4B
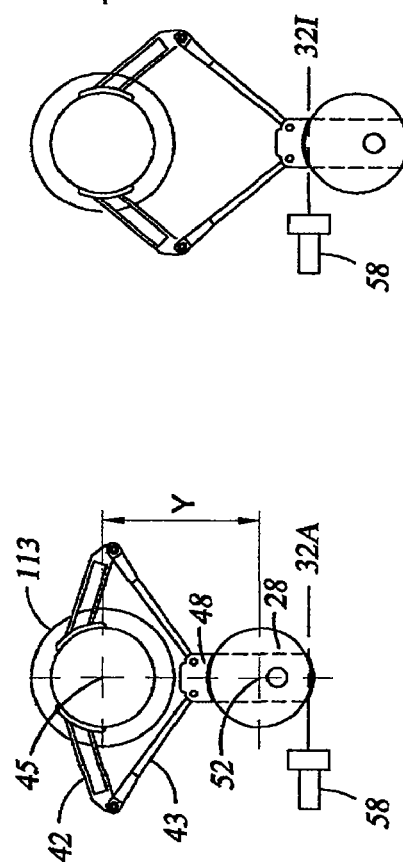
Fig. 4A
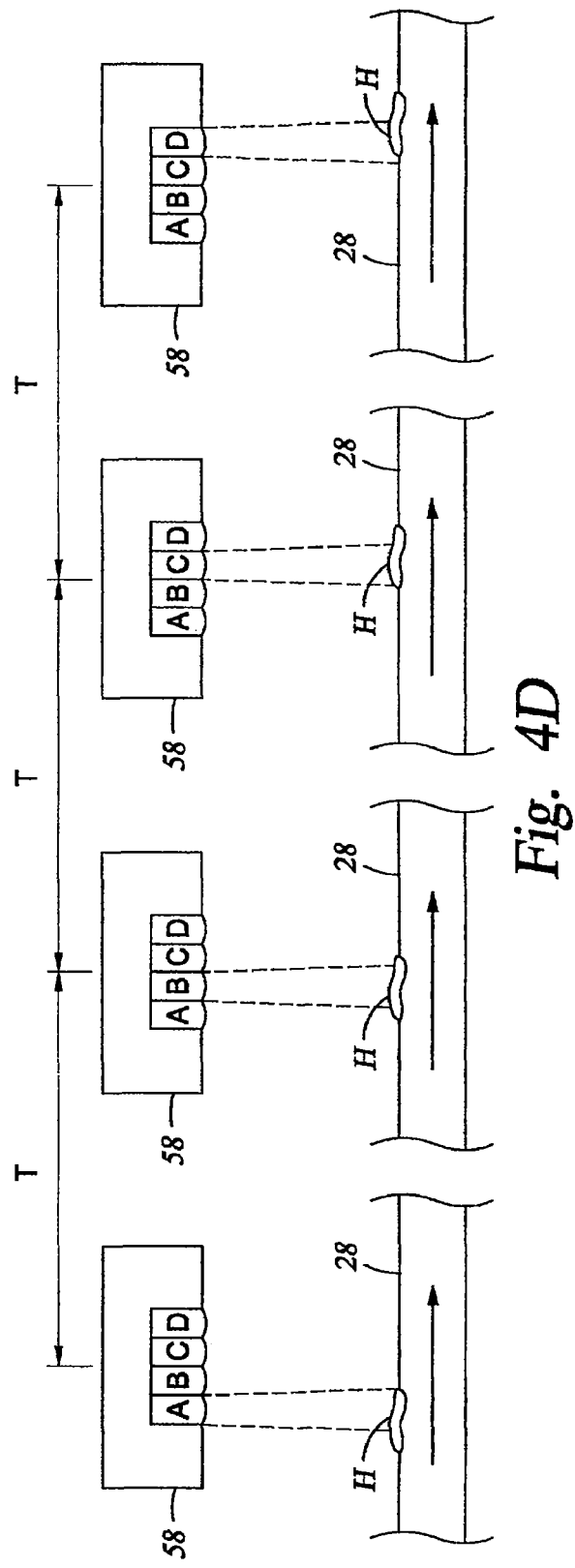
Fig. 4C
Fig. 4D

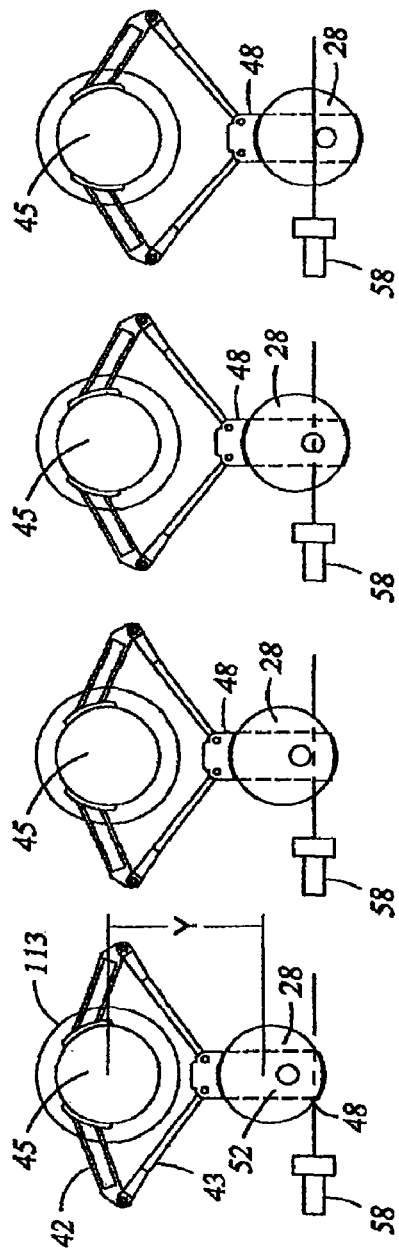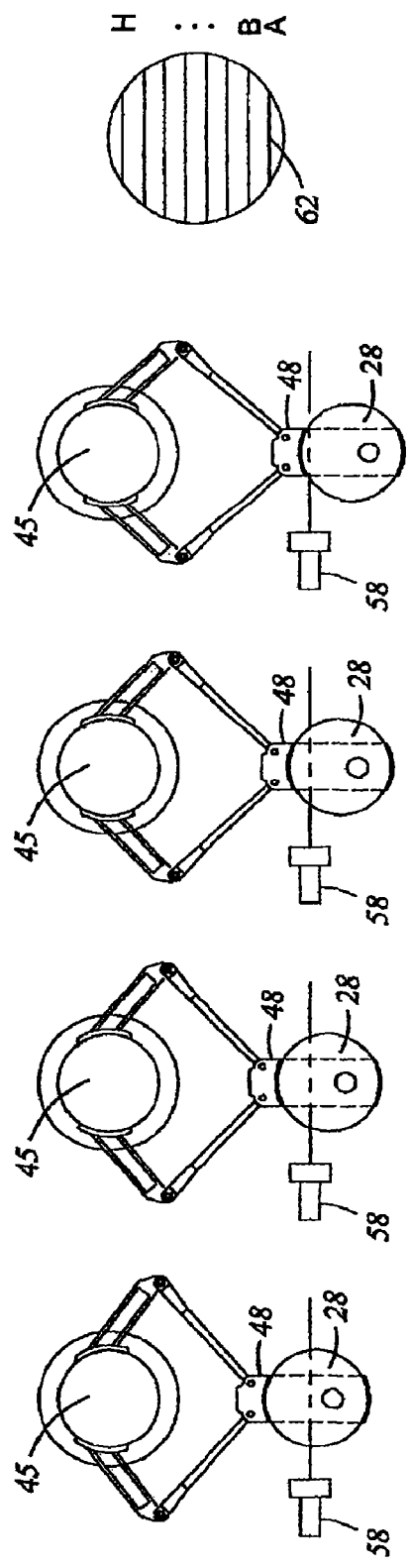

METHOD AND APPARATUS FOR SUBSTRATE IMAGING

CROSS-REFERENCE TO RELATED APPLICATION

This application is a continuation of U.S. patent application Ser. No. 09/886,307, filed Jun. 19, 2001, now abandoned which is incorporated by reference in its entirety.

BACKGROUND OF THE INVENTION

1. Field of the Invention

Aspects of the invention generally relate to a method and apparatus for substrate process inspection and monitoring.

2. Background of the Related Art

A chip manufacturing facility is composed of a broad spectrum of technologies. Cassettes containing semiconductor substrates are routed to various stations in the facility where they are either processed or inspected. Semiconductor processing generally involves the deposition of material onto and removal ("etching") of material from substrates. Typical processes include chemical vapor deposition (CVD), physical vapor deposition (PVD), electroplating, chemical mechanical planorization (CMP), etching and others. During the processing and handling of substrates, the substrates undergo various structural and chemical changes. Illustrative changes include the thickness of layers disposed on the substrate, the material of layers formed on the substrate, surface morphology, changes in the device patterns, etc. These changes must be inspected and controlled in order to produce the desired electrical characteristics of the devices formed on the substrate. In the case of etching, for example, end-point detection methods are used to determine when the requisite amount of material has been removed from the substrate. More generally, successful processing requires ensuring the correct process recipe, controlling process deviations (e.g., gas flow, temperature, pressure, electromagnetic energy, duration, etc) and the like.

To process substrates effectively, the processing environment must be sufficiently stable and free from contamination. Sources of contamination include wear from mechanical motion, degradation of seals, contaminated gases, contaminated substrates, flaking of deposits from processing chamber components, nucleation of reactive gases, condensation during chamber pumpdown, arcing in plasma chambers and so forth. Such sources of contamination may produce particles that can contact the substrates and result in defective devices. As the geometries of device features shrink, the impact of contamination increases. Thus, current semiconductor manufacturing sequences routinely include inspection of substrates for particles and/or aberrations to identify "dirty" processes or equipment.

Currently, comprehensive testing and analysis of substrates for process integrity and contamination requires the periodic or often constant removal of one or more substrates from the processing environment into a testing environment. Thus, production flow is effectively disrupted during the transfer and inspection of the substrates. Consequently, conventional metrology inspection methods can drastically increase overhead time associated with chip manufacturing. Further, because such an inspection method is conducive only to periodic sampling due to the negative impact on throughput, some contaminated substrates may be processed without inspection resulting in fabrication of defective devices. Problems are compounded in cases where the substrates are re-distributed from a given batch making it difficult to trace back to the contaminating source.

Another disadvantage with conventional inspection systems is the prohibitive cost of the systems. Current systems are typically expensive, stand-alone platforms that occupy clean-room space. Due to the large area, or "footprint", required by the stand-alone inspection platforms, the cost of owning and operating such systems is high. With regard to particle detection, the cost is further increased because of the electro-optics equipment utilized. This equipment is configured to produce high-resolution detection of small-scale particles and requires high-fidelity mechanisms, which are generally expensive to operate. Additionally, considerations of reduced throughput described above further increase the cost of conventional inspection systems.

One method to alleviate the throughput problems of conventional inspection systems is through in situ inspection. In situ inspection is often accomplished through the placement of inspection systems along the transfer paths of the substrates. In situ inspection acquires real-time data "on-the-fly" about the process and/or the substrates, while the substrates are moving between processes, thereby minimizing or eliminating the impact of the inspection on the process throughput. The inspection systems typically include receiving devices that gather sample images of the moving substrates that are sent to a data processing system for analysis. The image-gathering devices may be time-domain integration cameras (TDI), line cameras, charge coupled device cameras (CCD), and the like. An example of an exemplary in situ inspection system is described in U.S. patent application Ser. No. 09/680,226, entitled "Method and Apparatus For Enhanced Embedded Substrate Inspection Through Process Data Collection And Substrate Imaging Techniques," filed on Oct. 6, 2000, and which is hereby incorporated herein by reference in its entirety.

Generally, in situ inspection systems require linear and/or synchronized linear substrate movements to accurately image a particular position coordinate, e.g., a location, on the moving substrate in order to detect and display on a monitoring system defects such as micron size particles, substrate surface conditions or aberrations, and the like. Although movements of the substrate transport system such as frog-leg and polar robots, conveyor belts, and other parts of the process system may include linear motion during substrate handling, many of the motions used to handle the substrate transportation are non-linear such as the acceleration and deceleration of the substrates as they are moved into and out of process chambers. Moreover, as the substrate is being moved from one process to the next, the linearity (e.g., smoothness) of the substrate motion is further influenced by system issues such as inertia, vibration, friction, and the like. Accordingly, depending upon the design and weight of the robot and substrate supporting surfaces, the number of available linear substrate movements required by the inspection process may be limited to specific portions of the substrate travel. For example, a frog-leg type of robot typically has two arms, each arm having a jointed arm section that is configured to allow the robot to extend and retract each arm when moving substrates into and from process chambers. The robot arms are typically driven by at least one motor such as a linear motor or stepper motor. During the extension or retraction of the substrate, the motor is accelerated or decelerated to extend the substrate or remove the substrate from a chamber or move a substrate along a transfer path. Typically, the motor has non-linear acceleration and deceleration movements as the motor is started and stopped. Furthermore, the robot arms are typically connected in such a way that the retraction and extension motion are usually non-linear with each rotational movement of the motor. Further, the robot generally includes a heavy blade on the extending end of the arms therefore increasing system inertia and vibration. Therefore, each rotation of the motor results in non-linear substrate movements through acceleration, deceleration, vibration, and fluctuations in velocity, which can affect the inspection process.

To resolve the issue of non-liner substrate movement during an in situ inspection process, carefully controlled synchronized imaging is often used to keep the inspection system synchronized with the substrate. Imaging synchronization generally refers to synchronizing the motion of the substrate with the imaging device, such as a line camera, so that the images are accurately acquired. For example, a conveyor belt system may include small imaging triggers, such as small optical trigger holes formed in the conveyor belt, magnetic devices, and other imaging triggers physically positioned to trigger the inspection system when it is time to acquire an image. Unfortunately, the imaging triggers are generally not physically small enough to allow for high-resolution imaging of the substrate and, under non-linear motion conditions between the trigger points may result in imaging distortions. Furthermore, due to the time delay (i.e., response bandwidth) between the imaging trigger and the actual image capture, the imaging trigger often limits the imaging system response. Therefore, to capture images accurately the substrate velocity is often slowed by the process system to accommodate the imaging system, degrading substrate-processing throughput.

Generally, the inspection system to properly acquire an image must generate and/or gather a considerable amount of light in order to focus and detect a defect or particle on the substrate surface as the substrate is moved through the process. Typically, the optical inspection system exposure is established by adjusting camera settings such as the aperture, exposure time, shutter speed, frame-rate, and the like, possibly impairing the image exposure and acquisition accuracy. For example, decreasing the shutter speed to obtain further exposure of a rapidly moving substrate surface area may blur the image, overexpose the slower moving portions of the substrate, and underexpose the more rapidly moving portions of the substrate. Unfortunately, improving the optical system response and sensitivity often requires increasing the cost of the equipment typically by adding more light sources, increasing the output intensity of the light sources, increasing the sensitivity of the receiving equipment, and the like. Therefore, improving system sensitivity often requires slowing the process, thereby decreasing throughput and increasing the cost of production.

FIGS. 1A-1I illustrate a substrate 28 under inspection being imaged, i.e., sampled, nine times at a constant rate by a receiver 58, such as a line camera. Each FIG. 1A-1I illustrates a single image position, i.e., the location on the substrate where the images 32A-I are acquired with respect to the center of the frog-leg robot 113. FIG. 1J illustrates the images 32A-I, or "image slices" of the substrate 28, as lines across the substrate surface. To detect micron size particles and aberrations on the surface of the substrate, each of the images 32A-I is typically narrow, less than 1 mm. For clarity, FIGS. 1A-1J represent only a fraction of the number of image positions required to completely image the substrate 28. As illustrated by FIG. 1J, the distance between each image 32A-I is variable.

FIG. 2 is a graph of the non-uniform distance imaging of the substrate 28 of FIG. 1 with respect to time. The y-axis represents the distance Y from the substrate center 52 to the frog-leg robot center 45. Further, the y-axis represents delta-Y, the distance between the image positions A-I. The x-axis represents the time from first image position A to the last image position 1. The velocity curve 205 illustrates the velocity change dv/dt (i.e., acceleration) of the blade center 52 during the imaging process due to the acceleration and deceleration of the substrate transport system. Additionally, curve 205 illustrates the velocity change between A and image position B is greater than the velocity change dv/dt between image positions H and I. The changing substrate velocity with respect to time results in a variation in delta-Y between the image positions.

FIG. 3 is an illustration of a distorted substrate output image 30 on a display 300 due to the non-linear imaging process illustrated by FIGS. 1 and 2. Generally, the display 300 is a linear device such as a monitor, television, and the like, where the screen is refreshed at a constant rate and requires a linear input to properly display an image. The x-axis and y-axis of the display 300 represent the distance from the center of the image, e.g., the substrate 28. The display 300 may be used to determine a coordinate of a particle and/or a defect on the substrate surface. For example, a particle at the center of the substrate 28 is 0,0. However, as the inspection system is acquiring the images at a constant rate from a non-linear substrate, the defect coordinate is inaccurate relative to the actual position on the substrate surface. For example, for an eight-inch diameter substrate 28 displayed on the display 300, the first image 32A is positioned at approximately minus four inches from the center of the substrate 28. Subsequent images 32B-I are displayed with a spacing of about 1 inch between each image. However, the actual spacing between the images are not uniform as indicated by FIGS. 1J and 2. For example, the delta-Y between image position A and B is about 2 inches. Therefore, as the acquired images 32A-I from the inspection system are displayed on the display 300, the actual distance between the images 32A-I changes relative to the constant refresh rate of the display 300, distorting the substrate image 30. Thus, the distorted image 30 causes inaccurate coordinate measurements of the substrate surface.

FIGS. 4A-G illustrate an in-situ inspection system where the receiver 58 is a time-domain integration (TDI) camera. The TDI camera may be used to increase the sensitivity for imaging moving substrates. The TDI camera operates in a similar way to other cameras, such as the line camera, except the TDI camera operates on the principle of integrating multiple exposures, i.e., multiple images, of the same subject, to increase the overall exposure of the subject. Typically, the TDI camera has several adjacent rows of light gathering sensors that image the same subject, as the subject passes beneath each sensor row. For example, FIG. 4C illustrates one TDI camera having four rows of sensors A-D representing 4096 bytes of information per row.

FIG. 4D illustrates an imaging sequence of a desired image position H corresponding to image 32H. The image sequence is set to an integration time T between each exposure. At the start of the sequence, sensor row A is given an image trigger signal by, for example, a controller, or user, and acquires the first image of image position H and sends the image data of image H to sensor set row B. At the end of the integration time T a second image of image position H is taken by sensor row B and is integrated with the previous image position H from sensor row A, and so on for each sensor row C and D. Unfortunately, to ensure that each sensor row (e.g., A-D) is identically aligned with the image position H, the conventional TDI camera typically requires that the moving substrate be synchronized with the integration time T and linear in movement. However, if the substrate image position H is not synchronized and aligned for each sensor row A-D, the resultant image is a composite of different images resulting in a defective and perhaps meaningless composite image output. For example, as illustrated by FIG. 4D, image position H is not aligned with each of the sensors A-D which may result in a distorted composite (i.e., integrated) image.

Therefore, there is a need for a method and apparatus for in-situ inspection and imaging of substrates in non-linear systems that provide accurate image results.

SUMMARY OF THE INVENTION

Aspects of the invention generally provide a method and apparatus for substrate inspection and imaging. One embodiment of the invention provides an apparatus including at least one transmitter, at least one receiver, a controller coupled to the receiver and the transmitter where the controller includes a processor and at least one substrate imaging program that when executed on the processor performs the steps of determining the trigger intervals for at least two trigger signals for the acquisition of at least two images on a substrate surface moving with non-linear motion where a first trigger interval corresponds to a first image position and a second trigger interval corresponds to a second image position, then transmitting one or more optical signals from the transmitter to the first and second image positions on the substrate surface receiving the at least two trigger signals at the receiver where the two trigger signals include a first trigger signal corresponding to the first trigger interval, and a second trigger signal corresponding to the second trigger interval, and then receiving a portion of the one or more optical signals at the receiver from the first image position and the second image position.

In another embodiment, the invention provides for a method of substrate imaging including determining the trigger intervals for at least two trigger signals for the acquisition of at least two images on a substrate surface moving with non-linear motion wherein a first trigger interval corresponds to a first image position and a second trigger interval corresponds to a second image position, then transmitting optical signals from a transmitter to the first and second image positions on the substrate surface, receiving the at least two trigger signals at a receiver where the two trigger signals include a first trigger signal corresponding to the first image position, and a second trigger signal corresponding to the second image position, then receiving a portion of the optical signals at the receiver from the first image position and the second image position; processing the optical signals into an image, and then displaying the image.

In another embodiment, the invention provides a method of substrate imaging, including determining an interval corresponding to at least one image position defining an image on a non-linearly moving substrate surface, transmitting optical signals from a transmitter to the image position, then receiving, at a first sensor of the time-domain camera, a portion of the optical signals from the image position, processing the optical signals into a first image, determining an integration interval for a second sensor of the time-domain camera corresponding to the non-linear movement of the substrate surface, then receiving, at the second sensor, the optical signals from the image position, processing the optical signals into a second image, and then integrating the first and second images.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 1A-1I illustrate a substrate surface being imaged nine times by a prior art optical inspection system.

FIGS. 4A-D illustrates a time-domain integration camera and an imaging sequence during non-linear substrate movement.

FIGS. 12A-12H illustrate a substrate being imaged eight times by an imaging system using the method of FIG. 11, while FIG. 12I illustrates "image slices" of the substrate surface as lines across the substrate surface.

DETAILED DESCRIPTION OF THE PREFERRED EMBODIMENT

Embodiments of the invention have particular advantages in multi-chamber processing systems. One exemplary multi-chamber processing system commonly used in the semiconductor industry, well suited for supporting the imaging apparatus and method described herein, is known as a cluster tool. A cluster tool is a modular system comprising multiple chambers that perform various functions including substrate center-finding and orientation, degassing, annealing, deposition and/or etching. The multiple chambers are mounted to a central transfer chamber which houses a robot adapted to shuttle substrates 28 between the chambers. The transfer chamber is typically maintained at a vacuum condition and provides an intermediate stage for shuttling substrates 28 from one chamber to another and/or to a load lock chamber positioned at a front end of the cluster tool.

Figure 5:
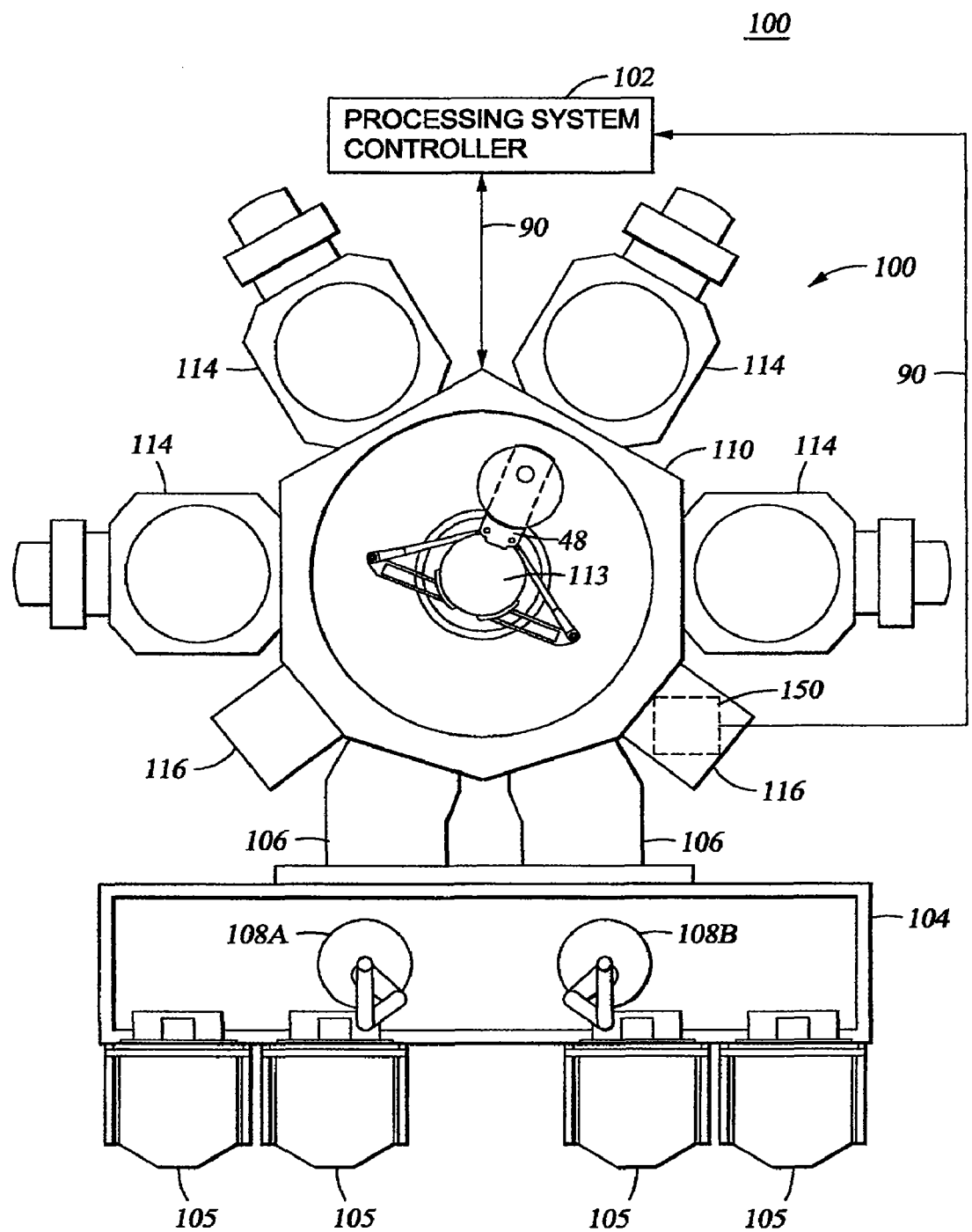
FIG. 5 is plan-view of a cluster tool that may be used to advantage.

FIG. 5 is a plan view of one embodiment of a processing system 100 in which embodiments of the invention may be used to advantage. The arrangement and combination of chambers may be altered for purposes of performing specific steps of a fabrication process. The processing system 100 generally includes a plurality of chambers and robots and is preferably equipped with a processing system controller 102 programmed to carry out the various processing and inspection methods performed in the processing system 100. A front-end environment 104 is shown positioned in communication with a pair of load lock chambers 106. At least one pod loader 108 is disposed in the front-end environment 104 is capable of linear, rotational, and vertical movement to shuttle substrates 28 between the load locks 106 and a plurality of pods 105 which are mounted on the front-end environment 104. The load locks 106 provide a first vacuum interface between the front-end environment 104 and a transfer chamber 110. Two load locks 106 are provided to increase throughput by alternatively communicating with the transfer chamber 110 and the front-end environment 104. Thus, while one load lock 106 communicates with the transfer chamber 110, a second load lock 106 communicates with the front-end environment 104. A robot 113 such as, for example, a frog-leg or polar type is centrally disposed in the transfer chamber 110 to transfer substrates 28 from the load locks 106 to one of the various processing chambers 114 and pre/post processing chambers 116. The processing chambers 114 may perform any number of processes such as physical vapor deposition, chemical vapor deposition, and etching while the pre/post processing chambers 116 are adapted for degassing, orientation, cool down and the like. The processing system controller 102 is electrically coupled to at least one imaging system 150 by an I/O (input-output) cable 90. In one aspect, the processing system controller 102 is adapted to provide command signals to, and receive data from, the imaging system 150.

Figure 6:
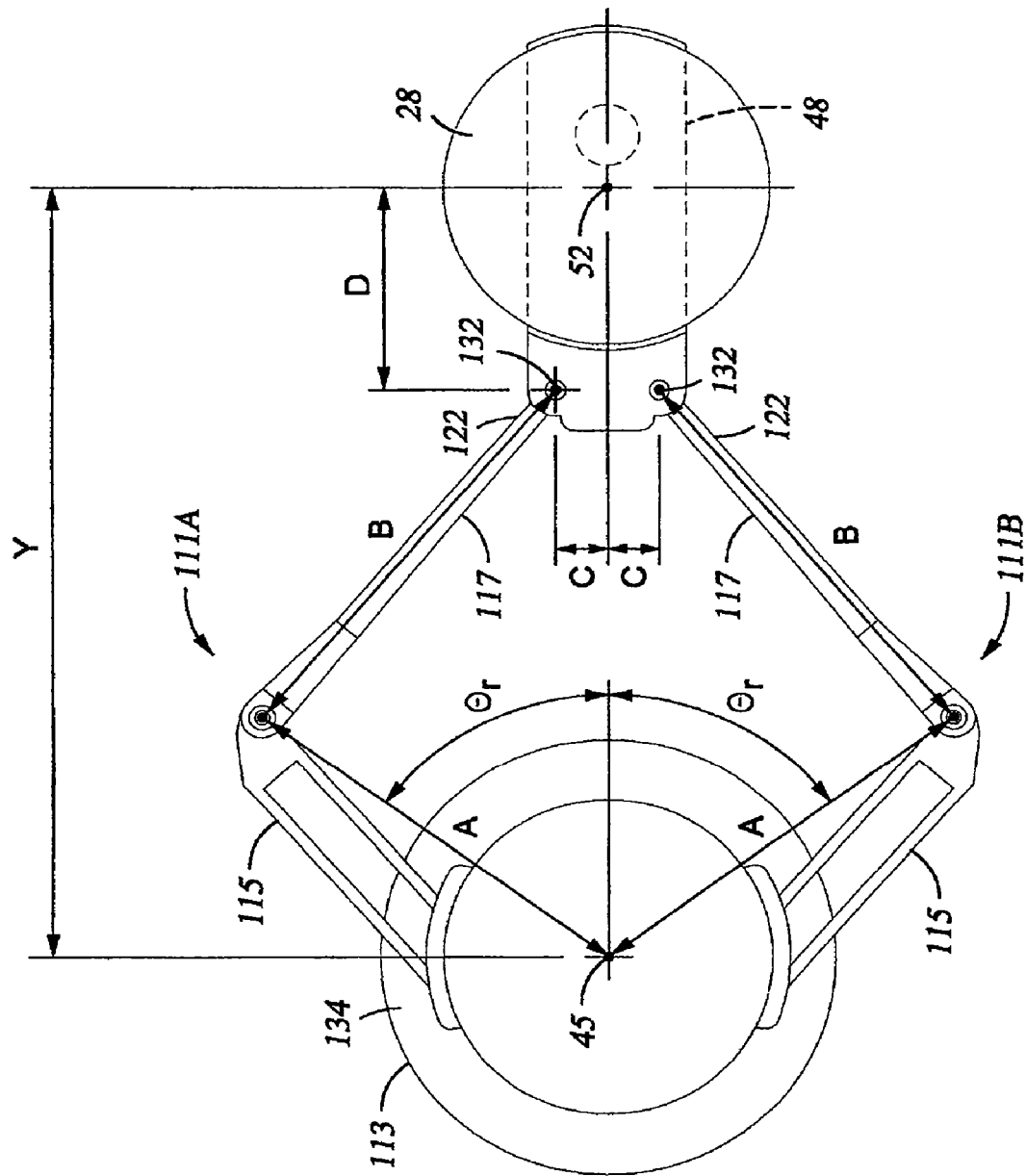
FIG. 6 is a diagram illustrating a frog-leg robot.

FIG. 6 illustrates one embodiment of the invention modeling the frog-leg robot 113. The robot 113 comprises a body 134 and an upper robot arm 111A and lower robot arm 111B rotatably coupled on one end to the robot body 134. Each robot arm 111A-B comprises an arm member 115 having a length A, and an arm extensions 117 having a length B. The arm extensions 117 are rotatably coupled on a second end 122 of the arm extensions 117 to a pivot point 132 of the blade 48. The distance between the robot center 45 and the blade center 52 is Y. The distanced from the pivot point 132 to the blade center 52 is D. The offset height of the pivot points 132 relative to the robot center 45 and blade center 48 is C. As the stepper motor 133 rotates step-wise, each of the arm members 115 and extensions 117 are rotated with respect to θr. The range of values for θr is about zero degrees to about 90 degrees relative to a horizontal line connecting the robot center 45 and the blade center 52.

Referring to FIG. 6, the retraction and extension distance Y of the robot blade center 52 relative to the center of the robot 45 is represented by the following equation $$Y = D + A\cos\theta r + \sqrt{B^2 - (A\sin\theta r - C)^2} \quad (1)$$

Where θr is represented by the following equation $$\theta r = \tan^{-1}\left(\frac{C}{Y-D}\right) + \cos^{-1}\left(\frac{A^2 + C^2 + (Y-D)^2 - B^2}{2A\sqrt{C^2 + (Y-D)^2}}\right) \quad (2)$$

The range of θr from about zero degrees to about 90 degrees corresponds to a minimum distance and maximum distance for Y, respectfully. For example, when the arm members 115 and the extensions 117 are fully extended and where C is about zero, θr is about zero degrees and Y is about the length of A plus B and D. When the arm members 115 and the extensions 117 are fully retracted, θr is about ninety degrees and Y is equal to about D.

Figure 7:
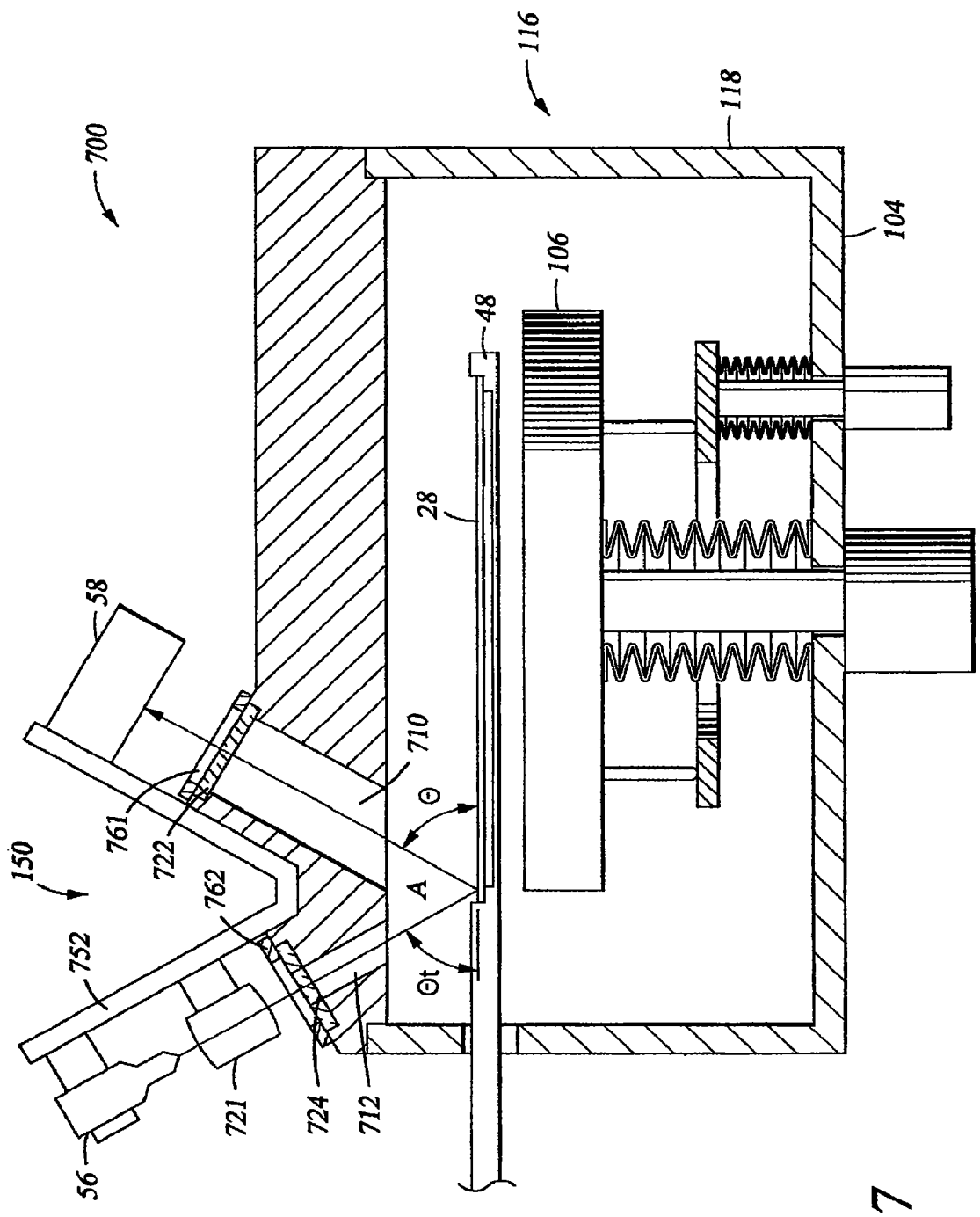
FIGS. 7-9 are cross-sectional views illustrating an imaging system and substrate motion within a chamber.
Figure 8:
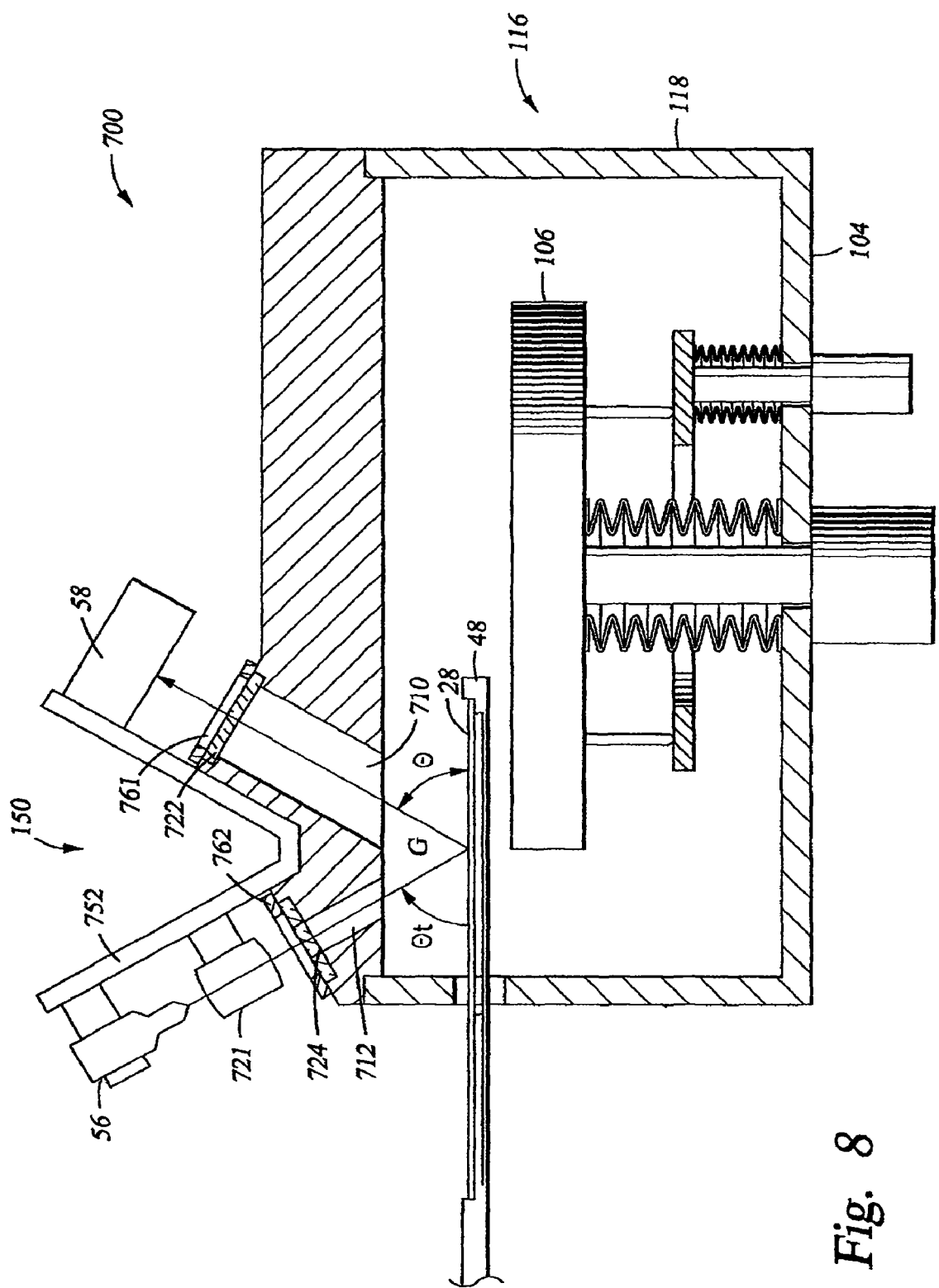
Figure 9:
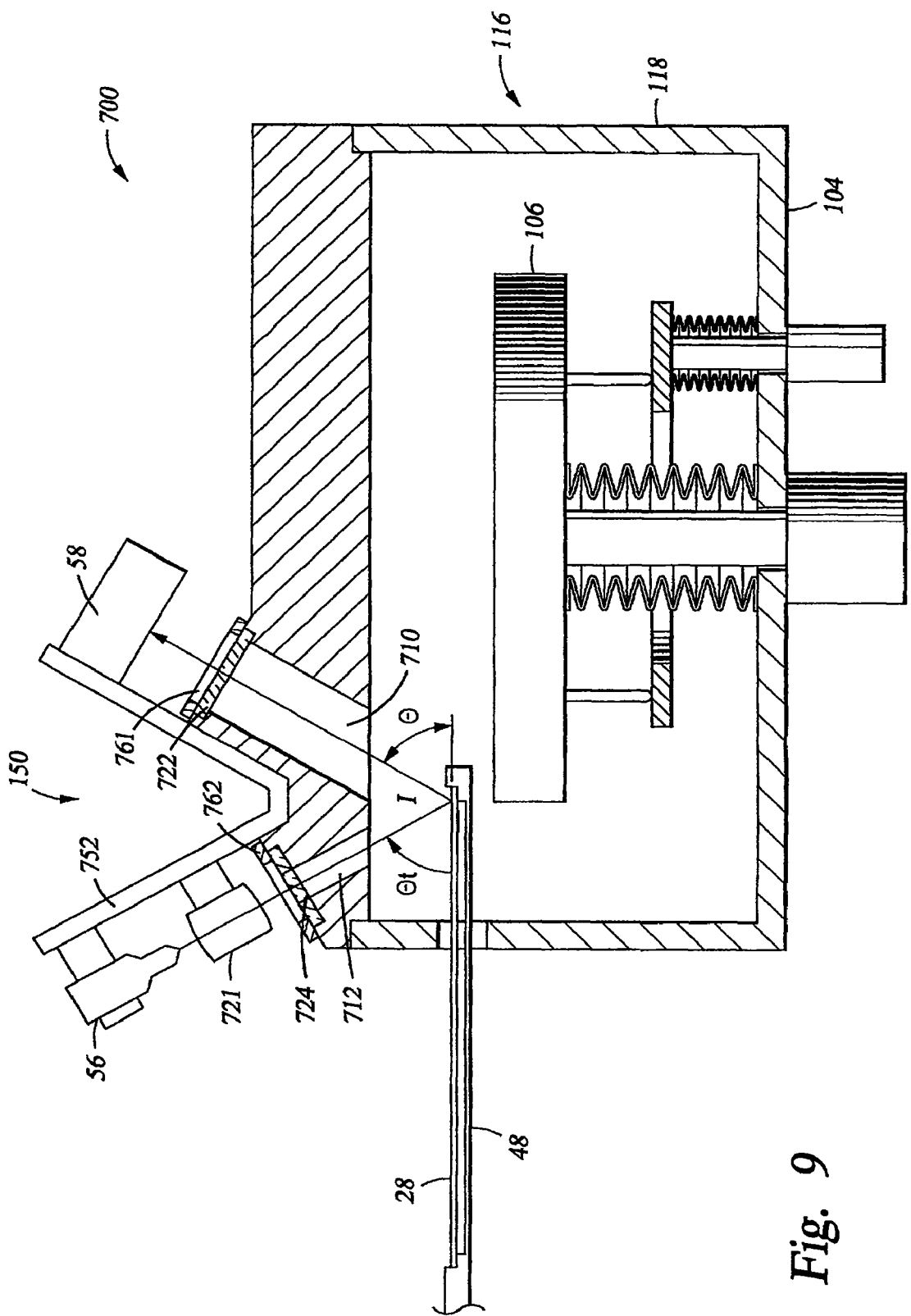

FIGS. 7-9 illustrate one embodiment of an in situ imaging system 150 mounted to the pre/post processing chamber 116 and the movement of a substrate 28 into the pre/post processing chamber 116. The pre/post processing chamber 116 generally includes a chamber body having sidewalls 118 and a bottom 104. A support member 106 may be disposed through the bottom of the pre/post processing chamber 116 to receive and support a substrate 28 introduced into the pre/post processing chamber 116. The support member 106 may include a cooling system, such as fluid channels and cooling fluid source, to provide substrate cooling.

A lid assembly 700 having the imaging system 150 mounted thereon is disposed at the upper surface of the chamber walls 118 and forms a seal therewith. The lid assembly 700 generally includes a body defining a port 710 therein to provide an aperture for a receiver unit 58, such as a charge coupled device (CCD), line camera, and the like, for receiving optical inputs from within the pre/post processing chamber 116. In addition, the lid assembly 700 generally includes a port 712 therein to provide an aperture for a light source 56 for illuminating the substrate 28. The receiver 58 and a light source 56 are secured to the lid assembly 700 by a mounting bracket 752 that may be mounted to the lid assembly 700 using conventional fasteners such as screws, bolts, and the like. In one embodiment, the light source 56 can be a halogen light source, broadband light source, narrowband light source, or other light source capable of operating in the 400 nm to 750 nm range {Range?}. The ports 710 and 712 have energy transparent windows 722 and 724, respectively, disposed therein to provide vacuum isolation within the pre/post processing chamber 116 on which the lid assembly 700 is disposed. The lid assembly 700 also includes an optics assembly 721 disposed between the window 724 and the light source 56. The optics assembly 721 can include any combination of filters, diffusers, lenses, and the like adapted to modify the light being emitted from the light source 56. The port 710 is disposed at an angle θ relative to a horizontal line in which the substrate 28 would be introduced into the pre/post processing chamber 116 (i.e., a substrate transfer path). The angle θ enables the receiver 58 to have a line of sight view to the substrate 28 as the substrate 28 enters and exits the pre/post processing chamber 116 on a robot blade 48. The port 712 is disposed at an angle θt relative to a horizontal line in which the substrate 28 would be introduced into the pre/post processing chamber 116 and is positioned in any desired angle suitable for the operation of the transmitter 56.

In some embodiments, the orientation of the receiver 58 and the light source 56 may be automatically adjusted (as opposed to manually). For example, although not shown, servos or similar actuators coupled to a control system may be used to move the various components adjust aperture size and focus from a remote location. The ports 710 and 712 may also include optical filters 761 and 762 respectively, such as polarizers, color spectrum filters, and other bandwidth selective mediums to attenuate, select, and filter the light spectrum. The optical filters 761 and 762 may be positioned on the atmospheric side of the windows 722 and 724, or formed integrally as part of the windows 722 and 724.

In one aspect, during substrate inspection the substrate surface is imaged, i.e., sampled, during the movement of the substrate 28 by the imaging system 150. For example, FIG. 7 illustrates the substrate 28 in position for the imaging system 150 to capture the image 32A at image position A. FIG. 9 illustrates the substrate 28 in position for the imaging system 150 to capture an image 32G at image position G. FIG. 9 illustrates the substrate 28 in position for the imaging system 150 to capture the image 32I at image position 1.

Substrate Imaging

Figure 10:
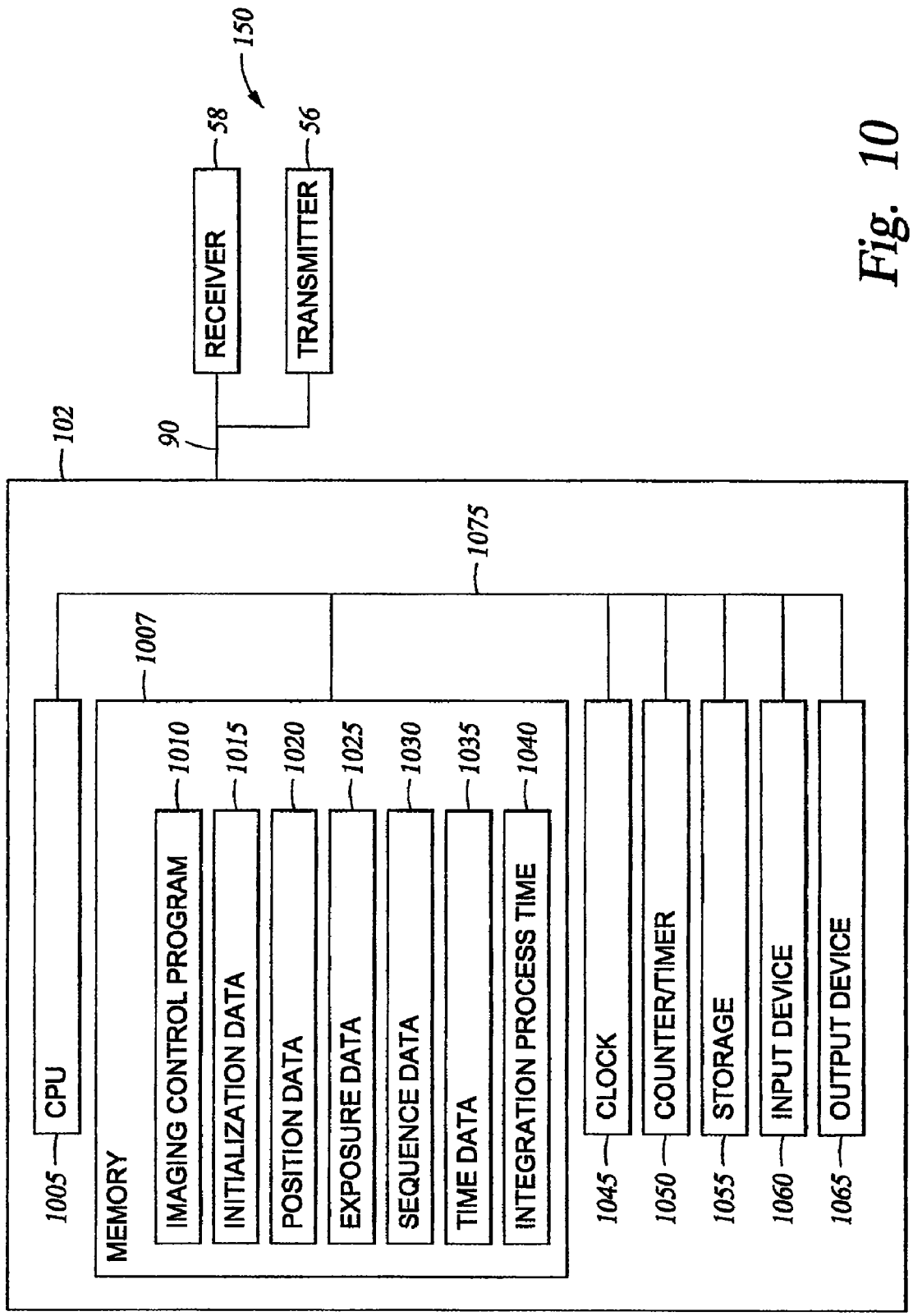
FIG. 10 depicts a process control system in which embodiments of the invention may be implemented.

FIG. 10 depicts one embodiment of the processing system controller 102 in which the invention may be implemented to advantage. In general, the processing system controller 102 includes a central processing unit (CPU) 1005 connected via a bus 1075 to a memory 1007, storage device 1055, input device 1060, output device 1065, and counter/timer 1050. The input device 1060 can be any device to give input to the processing system controller 102. For example, a keyboard, keypad, light-pen, touch-screen, track-ball, or speech recognition unit could be used. The output device 1065 is preferably any hardware adapted to interface and control the receiver 58. The counter/timer 1050 may be any digital device adapted to count up/or down in response to a specified count command from CPU 1005 and/or measure time. The clock 1045 sets the processing system controller clock rate, and may be integral to processing system controller 102 or be an external clock source.

Memory 1007 contains an imaging control program 1010 that, when executed on CPU 1005, provides support for controlling the imaging system 150. The imaging control program 1010 in the memory 1007 is in the form of program code conforming to any one of a number of different programming languages. For example, the program code can be written in C, C++, BASIC, Pascal, or a number of other languages.

Figure 2:
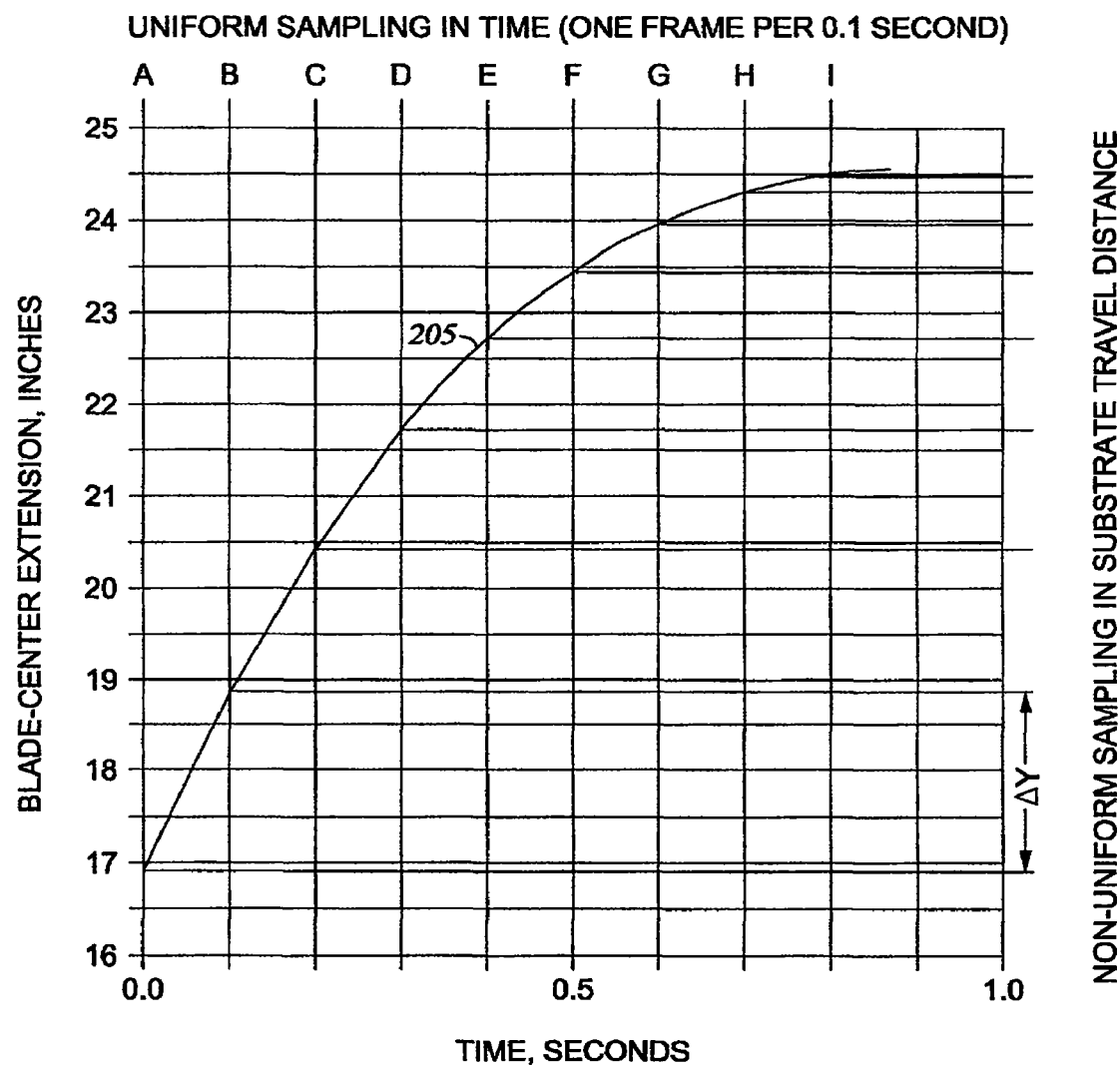
FIG. 2 is a graph and illustration of prior art non-linear motion imaging.
Figure 3:
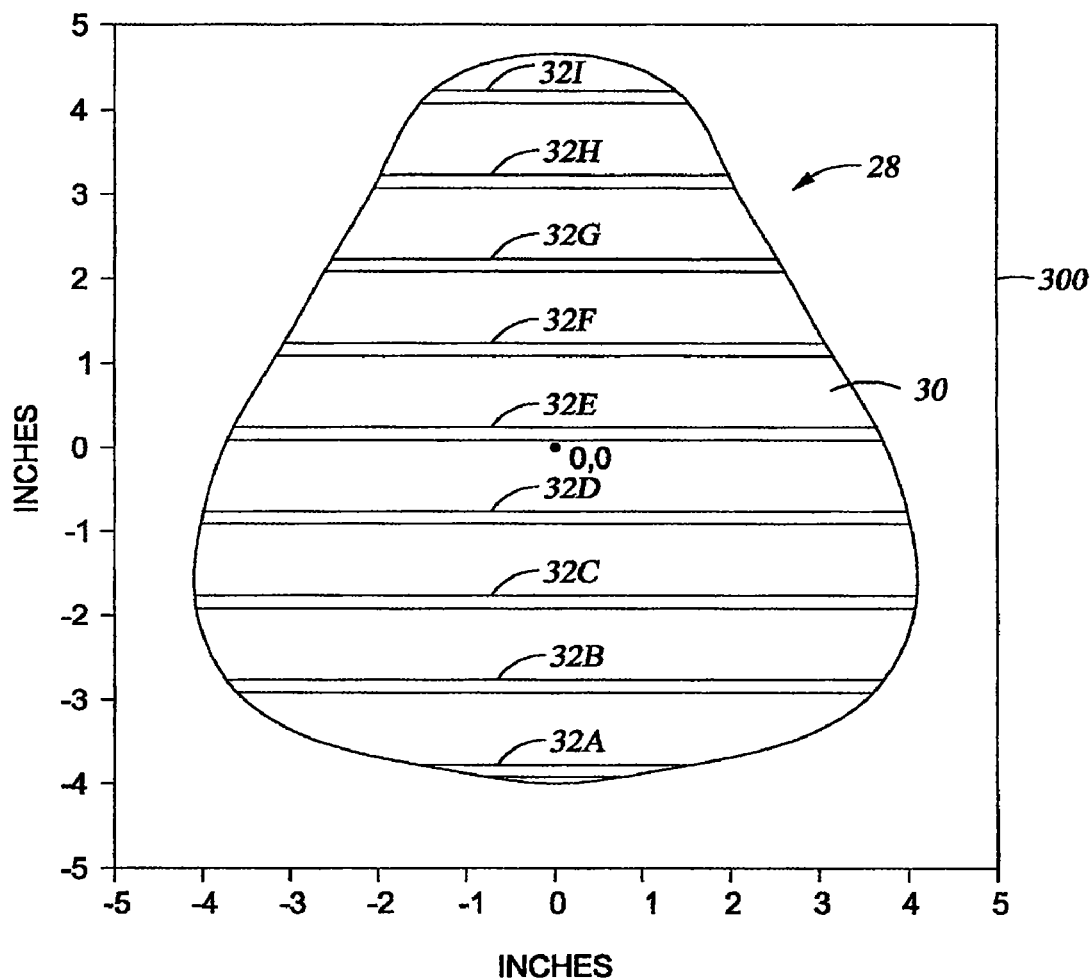
FIG. 3 is an illustration of an output image as a result of the imaging process illustrated by FIGS. 1 and 2.

In one aspect, each image on the substrate 28 is given an associated image position corresponding to the distance Y for each image position on the substrate surface relative to the robot center 45. For example, with reference to FIG. 3, the distance Y for image A from FIG. 1 is about 16.8 inches, whereas the distance Y for image B is about 18.8 inches, and so on for each image 32A-I. The image positions are stored in the position data structure 1015. In another aspect, each image position on the substrate 28 is given an associated trigger time value as the time to acquire each image relative to a starting time. The trigger time values are stored in the time data structure 1035.

Memory 1007 also includes exposure data 1025 for the receiver 58 to set the proper exposure, image capture sequence data 1030 to set the sequence the images will be acquired, time data structure 1035 which is the duration of time between each image capture, and initialization data 1015 including motor acceleration/deceleration data, calibration data, and the like. In another embodiment, the memory 1007 includes integration process time 1040 to facilitate the control and timing of the integration data between each TDI image sensor row.

The memory 1007 may be random access memory sufficiently large to hold the necessary programming and data structures of the invention. While memory 1007 is shown as a single entity, it should be understood that memory 1007 may in fact comprise a plurality of modules, and that memory 1007 may exist at multiple levels, from high speed registers and caches to lower speed but larger DRAM chips.

The storage device 1055 is preferably a direct access storage device (DASD), although it is shown as a single unit, it could be a combination of fixed and/or removable storage devices, such as fixed disc drives, floppy disc drives, tape drives, removable memory cards, or optical storage. Memory 1007 and storage device 1055 could be part of one virtual address space spanning multiple primary and secondary storage devices.

Figure 11:
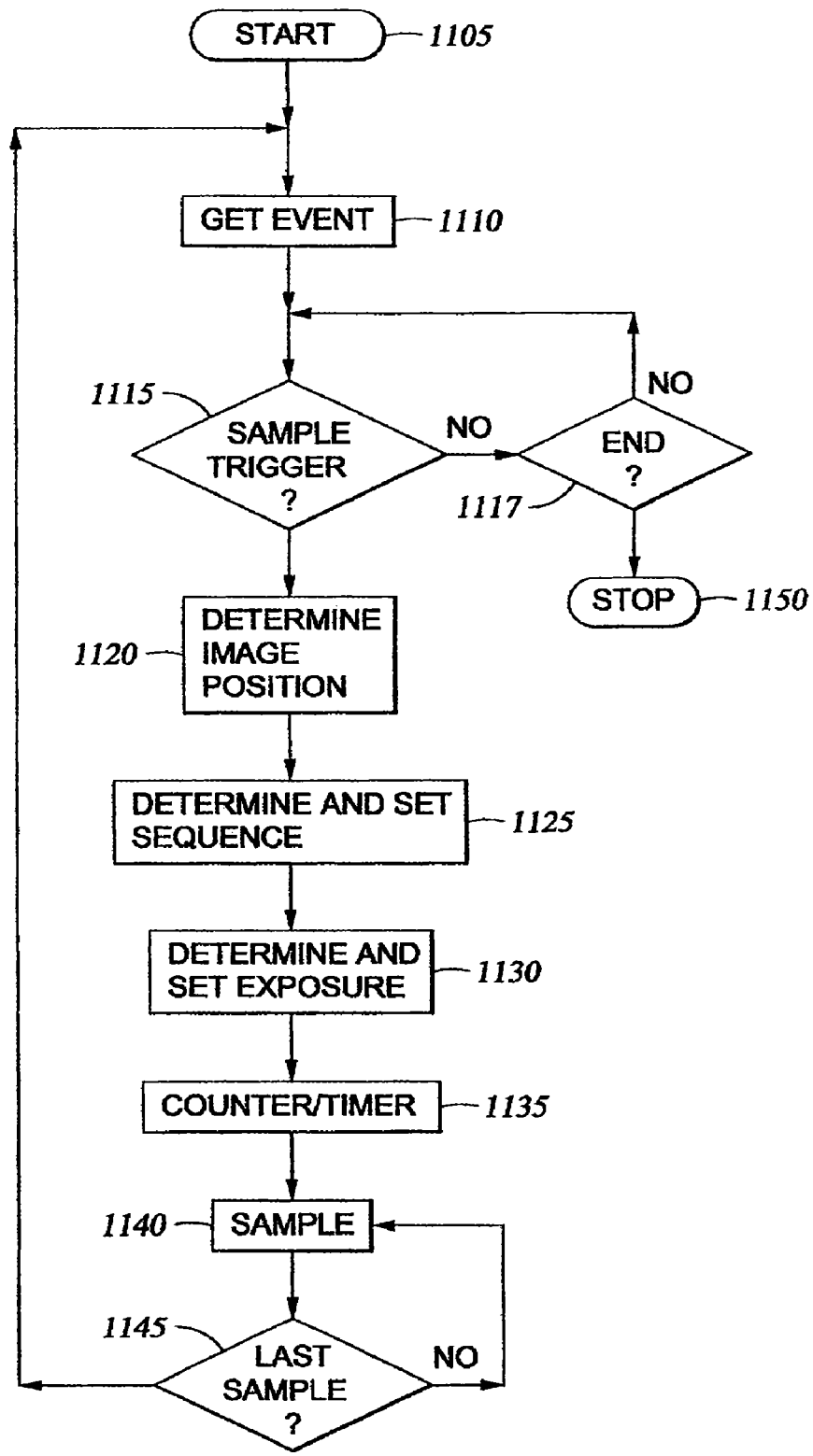
FIG. 11 is a flow diagram for a method for an imaging system that may be used with the invention.

FIG. 11 illustrates one embodiment of a method 1100 for synchronous or asynchronous control of the imaging system 150 by the processing system controller 102 using, for example, the imaging control program 1010. As necessary, FIGS. 1-10 are referenced in the following discussion of FIG. 11. In one aspect, for synchronous imaging, the processing system controller 102 calculates the number of stepper motor steps to synchronize the desired image position to the receiver 58 to accurately acquire each image. In another aspect, for asynchronous imaging, the processing system controller 102 estimates the imaging trigger time for the receiver 58 to accurately acquire each image at each image position.

The method of FIG. 11 is entered into at step 1105, when for example the processing system controller 102 begins the inspection of a substrate 28. Method 1100 at step 1110 gets an event such as a start-imaging trigger signal from the processing system controller 102. Although in some embodiments the start-imaging trigger signal is established and coordinated with the motor start sequence, other start-imaging trigger signals may be used such as light-beam, magnetic, and proximity sensors, and the like. Additionally, in some embodiments the start-imaging trigger signal be in electrical form such as TTL, CMOS, and the like, other types of start-imaging trigger signals are contemplated including signals such as optical, mechanical, magnetic, and the like, adapted to trigger and control the imaging system 150.

Method 1100 at step 1115 determines whether a start-imaging trigger event has occurred to begin the imaging process of the substrate 28. If the event is not a start-imaging trigger signal, then method 1100 proceeds to 1117. At step 1117, the method 1100 determines if the event is an end-imaging event. If the event is not an end-imaging event, the method 1100 returns to 1110 to get the next event. If the event is an end-imaging event, the method 1100 proceeds to 1150 and exits. If the event is a start-imaging trigger event, the method 1100 proceeds to step 1120 to determine the image positions of the substrate 28 using equations 1 and 2 for each image distance Y and, for synchronous and/or asynchronous operation.

In one aspect, to calculate the image position Y for each image, the number of images is determined for the diameter of the substrate 28 using the image width, i.e., image slice. Ideally, to accurately image the substrate 28, each image should abut the next image without overlap or separation. Thus, ideally, for a fixed width image, imaging in sequential order, the distance delta-Y to move from the center of one image position to the center of the next image position is about equivalent to the image width. Additionally, the image width establishes the number of images required to completely image the substrate surface. For example, for a substrate that is 300 mm in diameter having an image system 150 imaging width of 1 mm would require about three hundred adjacent images. The image length generally is set to the widest portion of the substrate 28.

For synchronous operation, using the equations 1 and 2 at step 1120 the method 1100 calculates the number of steps to reach θr for each image position Y, and stores them into position data structure 1020. In one aspect, θr is a function of binary (e.g., a byte) input to the stepper motor 133 from the processing system controller 102. The binary input sets the number of stepper motor steps, i.e. the amount of stepwise rotation, to achieve the θr.

At step 1125, the method establishes the image sequence. The image sequence may be established in a sequential order from the first image to the last image, e.g., image one to image three hundred, however, other sequences are contemplated. The sequence is then stored in the sequence data structure 1030.

At step 1130, method 1100 determines and sets the exposure time for each image position to properly expose the substrate surface. In one aspect, to determine the exposure time method 1100 determines the shutter and/or frame rate required for the desired exposure for each image position. The exposure time may be set to allow the smallest particles or aberrations of interest to be detected. However, other exposure times are contemplated. At step 1135, the system counter/timer 1050 is initialized. The counter/timer 1050 is used to count the number of steps to the image positions.

At step 1140, the imaging system 150 images the substrate 28. The substrate 28 may be imaged in any direction moving into or out of the pre/post processing chamber 116. For example, with reference to FIGS. 7-9, the robot 113 begins to move the substrate 28 on the blade 48 into the pre/post processing chamber 116 as the stepper motor 133 is initiated by processing system controller 102.

In one aspect, during the imaging sequence, the counter/timer 1050 is started about simultaneously with the stepper motor 133 and counts the number of stepper motor steps to reach each image position using the position data from position data structure 1020. For example, when the number of stepper motor steps equals the number of steps stored in the position data structure 1020 representing the first image position, the imaging system 150 acquires the first image. Upon completion of the acquisition of the first image, the counter/timer 1050 continues to count the number of steps corresponding to the second image position. When the number of counts equals the number of steps stored in the position data structure 1020 representing the second image position, the imaging system 150 acquires the second image, and so on for each image. The method 1100 at step 1145 determines if the last image position has been reached, i.e., the end of the sequence data 1030, if so then the method 1100 returns to step 1110 to wait for the next event. If not, then the method 1100 returns to step 1140.

For asynchronous operation, at step 1120, the method 1100 determines the trigger time for each image relative to a start trigger. Generally, the start trigger is set to about zero with reference to the start of the imaging sequence but may be any time value leading or lagging the image sequence. To determine the trigger time, method 1100 obtains the step times, i.e., step time and dwell times at each step, from the stepper motor response curve data located within the initialization data 1015 of memory 1007, and the number of stepper motor steps using equations 1 and 2 for each image position, then sums the number of step times to obtain the specified trigger time for each image position. The results of the trigger times are then stored within the time data structure 1035.

At step 1130, method 1100 determines and sets the exposure time for each image. In one aspect, to determine the exposure time method 1100 determines the shutter and/or frame rate required for the desired exposure for each target. The exposure time may be set to allow the smallest particles or aberrations of interest to be detected. However, other exposure times are contemplated. At step 1135, the clock 1145 is started counting the time to the first image position. The imaging system 150 begins acquiring the image at the specified trigger time intervals with respect to the start trigger received at step 1115.

At step 1140, the imaging system 150 acquires images of the substrate 28. The substrate 28 may be imaged in any direction moving into or out of the pre/post processing chamber 116. For example, with reference to FIGS. 7-9, the robot 113 begins to move the substrate 28 on the blade 48 into the pre/post processing chamber 116 as the stepper motor 133 is initiated by processing system controller 102.

In one aspect, the counter/timer 1050 is started about simultaneously with the stepper motor and counts the time to reach the image positions using the trigger time data from time data structure 1035. For example, when the trigger time equals the trigger time stored in the time data structure 1035 representing the first image position, the imaging system 150 acquires the first image. Upon completion of the acquisition of the first image, the counter/timer 1050 continues to count the time corresponding to the second image position. When the trigger time equals the trigger time stored in the time data structure 1035 representing the second image position, the imaging system 150 acquires the second image, and so on for each image. The method 1100 at step 1145 determines if the last trigger time has been reached, i.e., the end of the sequence data 1030, if so then the method 1100 returns to step 1110 to wait for the next event. If not, then the method 1100 returns to step 1140.

FIGS. 12A-H illustrate a substrate 28 being imaged eight times at a variable rate by the imaging system 150 comprising a receiver 58, using method 1100. The variable rate corresponds to the non-linear movement of the substrate 28. Each FIG. 12A-12H illustrates a single image position A-H, i.e., the location on the substrate where images 62A-H are acquired. FIG. 12I illustrates the images 62A-H, or "image slices" of the substrate surface as lines across the substrate surface. To detect micron size particles and aberrations on the substrate surface, each of the images 62A-H is typical very narrow, less than 1 mm, so a large number of images are required to completely capture the substrate image. For clarity, FIGS. 12A-I represent only a fraction of the number of image positions A-H required by the imaging system 150 to fully capture the substrate image. As illustrated by FIG. 12I, the distance (i.e., delta-y) between each image positions is about identical.

Figure 13:
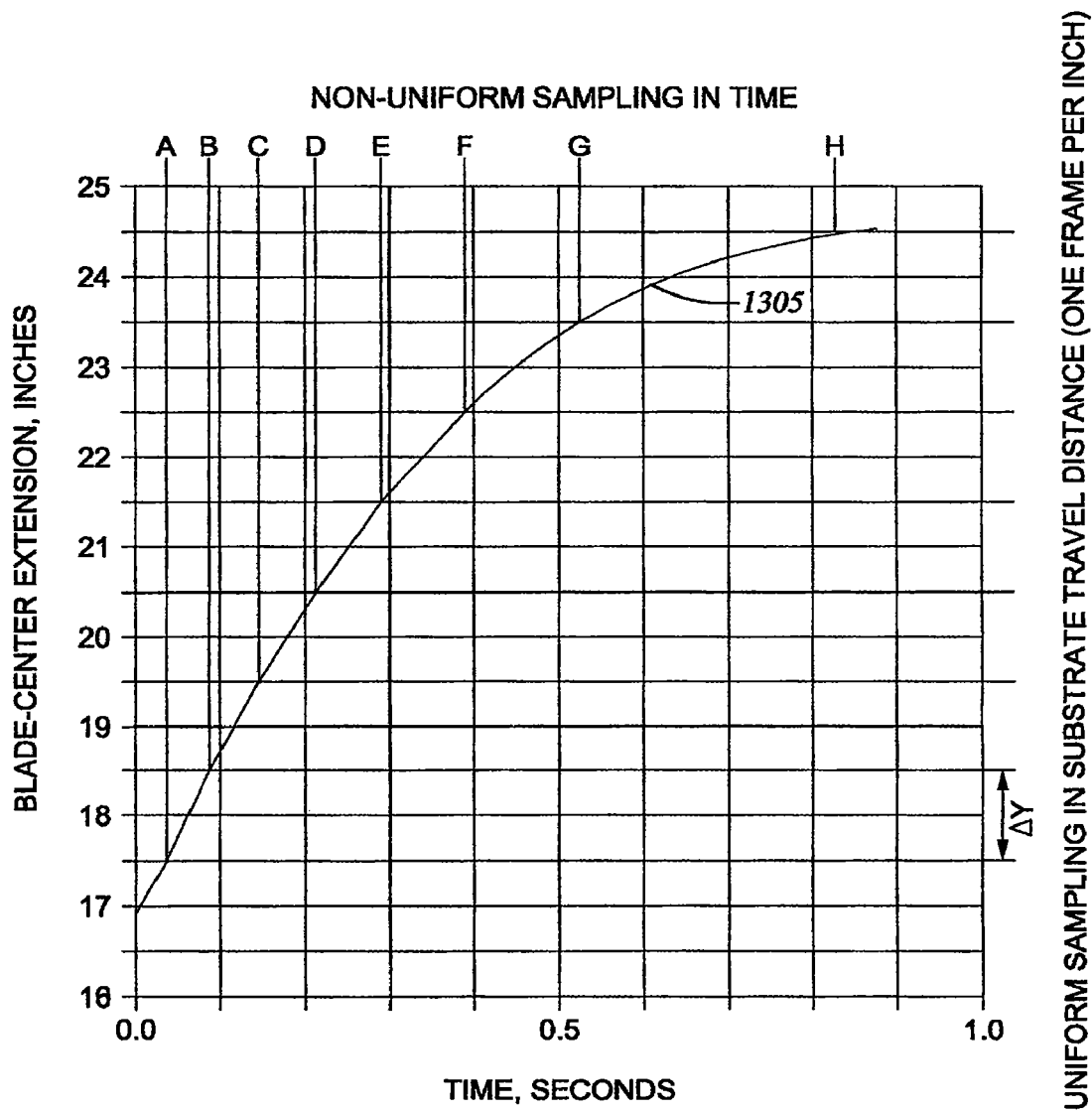
FIG. 13 is a graph and illustration of a non-linear motion imaging.

FIG. 13 is a graph of the non-uniform time imaging of the substrate 28 of FIG. 1 with respect to distance using method 1100. The y-axis represents the distance Y from the substrate center 52 to the frog-leg robot center 45. Further, the y-axis represents the delta-Y, the distance between the image positions A-H. The x-axis represents the time from first image position A to the last image position H. The velocity curve 1305 illustrates the velocity change dv/dt (i.e., acceleration) of the blade center 52 during the imaging process due to the acceleration and deceleration of the substrate transport system. Additionally, curve 1305 illustrates the velocity change between A and image position B is greater than the velocity change dv/dt between image positions G and H. The variable image trigger time for each image position A-H compensates for the changing system velocity resulting in about a constant delta-Y between each image position A-H.

Figure 14:
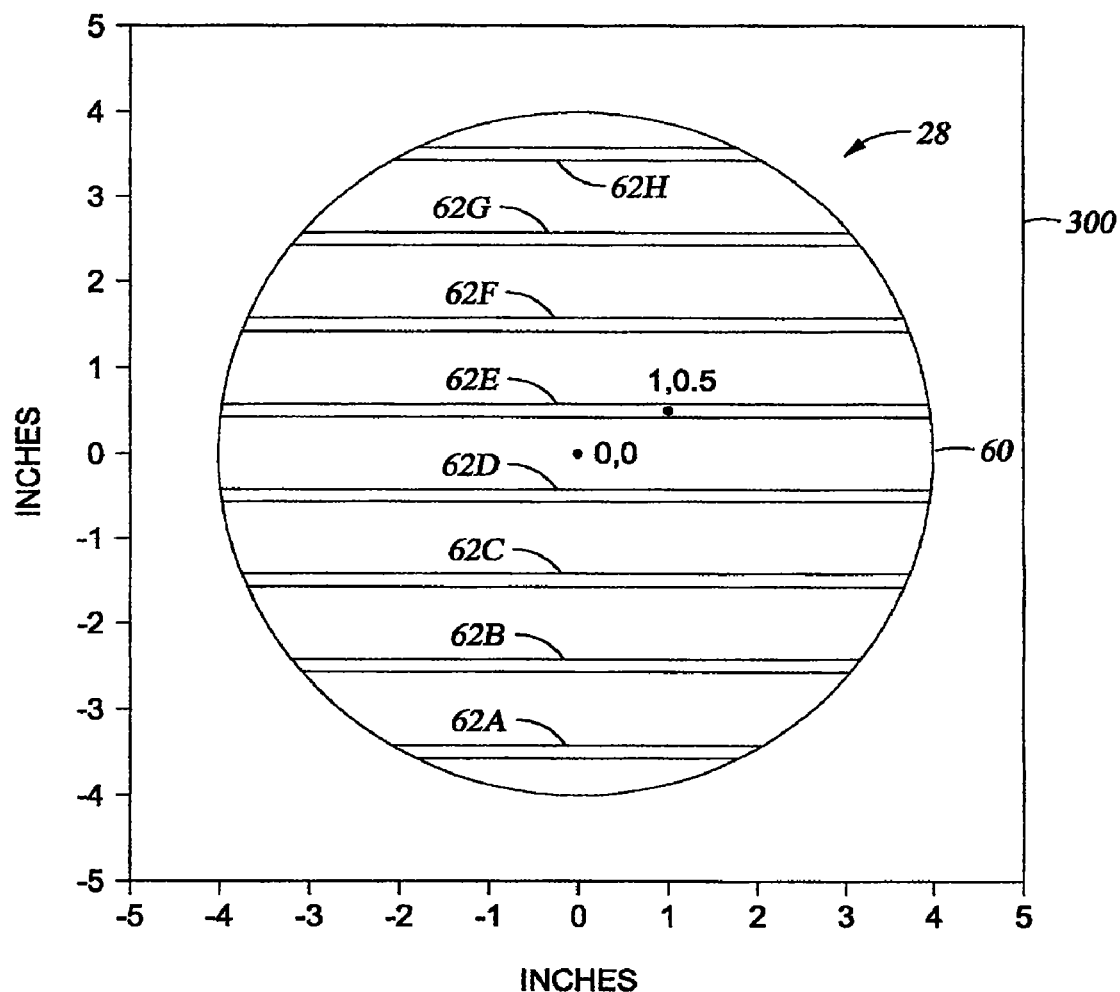
FIG. 14 is an illustration of an output image as a result of the imaging process of FIGS. 11-13.

FIG. 14 is a diagram of an image output using method 1100 for either synchronous or asynchronous operation. The x-axis and y-axis represent the distance from the center of the displayed substrate 28.

Generally, the display 300 is a linear device such as a monitor, television, and the like, where the screen is refreshed at a constant rate and requires a linear input to properly display an image. The x-axis and y-axis of display 300 represent the distance from the center of the substrate 28. Using method 1100, the imaging system 150 is acquiring the images at a non-linear rate corresponding to the non-linear system therefore a surface coordinate is about accurate. For example, for an eight-inch diameter substrate the first image 61A is correctly positioned at minus three and one-half inches from the center of the substrate, as it is the first image on the display 300. As the rate of imaging is variable and is an function of time, or steps, to reach the correct image position, subsequent images 61A-H are spaced about the same apart, resulting in a linear non-distorted image of substrate 28.

As the coordinate positions on the display 300 are about accurate to the actual substrate surface, the displayed image 60 may be used to locate a particle and/or defect on the substrate surface. A particle at the center of the substrate 28 is 0,0. For example, A particle at 1,0.5 would indicate that, measured from the center of the image 60, the particle would be 1 inch along the x axis and 0.5 inches along the y axis from the center of the substrate 28. Thus, as the image correlates to the actual substrate surface dimensions the image coordinate x,y for a particle or aberration should match the actual location of the partial or aberration on the substrate surface.

Figure 15:
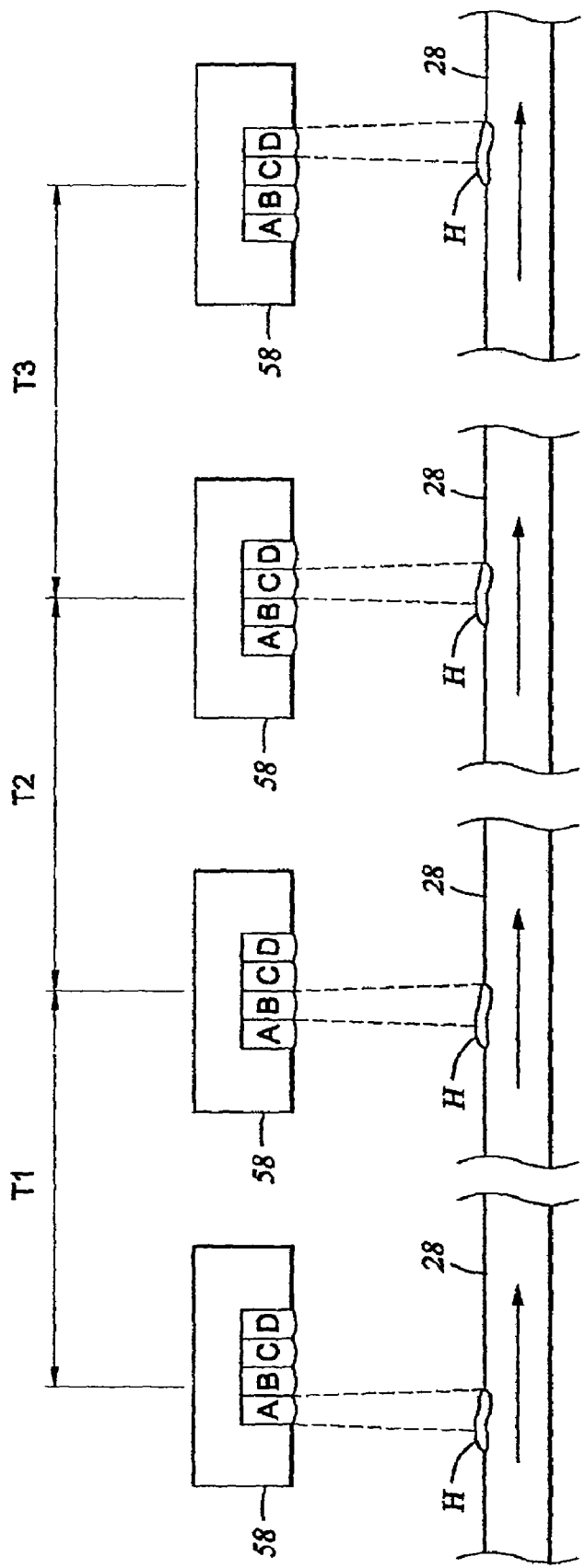
FIG. 15 is a diagram illustrating a time domain integration camera imaging a position on a substrate surface during non-linear motion using the method of FIG. 11.

FIG. 15 illustrates one embodiment of the imaging system 150 where the receiver 58 is a TDI camera adapted to receive signals from the processing system controller 102 to trigger each multiple exposure to the number of steps between each TDI sensor row A-D for synchronous operation, or vary the image process time T for asynchronous operation.

The TDI camera has several rows of light gathering sensors A-D that acquire the same image position as the image position passes beneath each sensor row. As each row of the TDI camera is exposed, acquiring the image, the image data is then passed to the next row and subsequently added, i.e., integrated, with the exposure of the next row of the same image. The variable integration process times T1-3 are the times between each subsequent exposure. For example, FIG. 15 illustrates one embodiment of the TDI camera having four rows of sensors A-D representing 4096 bytes of information per row. FIG. 15 illustrates an imaging sequence for multiple exposures of image position H corresponding to image 62H, on the substrate surface.

For synchronous operation, at step 1125, using equations 1 and 2 the method 1100 determines the number of stepper motor steps, i.e., stepwise rotation, between each sensor row A-D where the image position H is about properly aligned. Method 1100 stores the steps for rows A-D into the position data structure 1020. At step 1130, the exposure is set by the amount of time required by the sensor rows A-D to properly expose the image position H for each sensor row A-D to acquire the image 62H.

At step 1140, the imaging system 150 images the substrate 28. During the imaging process, the counter/timer 1050 is started about simultaneously with the first image exposure of image position H at row A, and counts the number of stepper motor steps to reach each subsequent image exposure row B-D using the position data from position data structure 1020. For example, when the number of stepper motor steps equals the number of steps stored in the position data 1020 representing the point where the image position H is properly aligned with the row B for imaging, the imaging system 150 acquires the second exposure of image position H using sensor row B. Upon completion of the acquisition of the second exposure, the counter/timer 1050 continues to count the number of steps corresponding to the next sensor row C. When the number of counts equals the number of steps stored in the position data 1020 representing the point where the image H is aligned with the row C for imaging, the imaging system 150 acquires the third exposure of image position H. Upon completion of the acquisition of the third exposure of image position H, the counter/timer 1050 continues to count the number of steps corresponding to the last sensor row D. When the number of counts about equals the number of steps stored in the position data 1020 representing the point where the image H is properly aligned with the row D for imaging, the imaging system 150 acquires the fourth exposure of image position H. The method 1100 at step 1145 determines if the last image position has been reached, i.e., the end of the sequence data 1130, if so then the method 1100 returns to step 1110 to wait for the next event. If not, then the method 1100 returns to step 1140 to image the next image position.

For asynchronous operation, the integration process times T1-T3 are varied to establish the time for image position H to be properly aligned with each sensor row A-D. Method 1100, at step 1120 determines the integration process time for each image position relative to the first image position from sensor row A. To determine integration process times T1-T3, method 1100 obtains the step times such as step and dwell times from the stepper motor response curve data located within the initialization data 1015 of memory 1107, calculates the steps between each sensor row A-B using equations 1 and 2, and counts the time between sensor rows A-D using counter/timer 1050. Method 1100 then sums the number of step times between each row to obtain the specified integration process times T1-T3 between each sensor row A-D. The results of the integration process times are then stored within the time data structure 1035.

At step 1130, the exposure is set by the amount of integration process time T1-T3 required by the sensor rows A-D to properly expose the image position H. At step 1135, the clock 1045 is started, triggering the imaging system 150. The imaging system 150 begins acquiring the image at the specified trigger time intervals with respect to the start trigger received at step 1115.

At step 1140, the imaging system 150 acquires images of the substrate 28. In one aspect, the counter/timer 1050 is started about simultaneously with the first sensor row A image acquisition, and counts the integration process time T1 from time data structure 1035 to reach the second sensor row B. For example, when the counted integration process time corresponds to about T1 stored in the time data structure 1040, the imaging system 150 acquires the second exposure of image position H using sensor row B. Upon completion of the acquisition of the second exposure, the counter/timer 1050 continues to count the integration process time T2 corresponding to the next sensor row C. When the counted integration process time corresponds to about T2 stored in the position data 1020, the imaging system 150 acquires the third exposure of image position H. Upon completion of the acquisition of the third exposure of the image position H, the counter/timer 1050 continues to count the integration process time corresponding to the last stored integration process time T3 for sensor row D. When the integration process time corresponds to about T3 stored in the position data 1020, the imaging system 150 acquires the fourth exposure of image position H. The method 1100 at step 1145 determines if the last image position has been reached, i.e., the end of the sequence data 1030, if so then the method 1100 returns to step 1110 to wait for the next event. If not, then the method 1100 returns to step 1140 to image the next image position.

It should be noted that, although embodiments of the invention facilitate in situ inspection and imaging of substrates while moving non-linearly with respect to the motion of a stepper motor driven robot other embodiments are contemplated. For example, the robot may be driven by a linear or non-linear motor having a rotational feedback mechanism to establish and monitor the desired rotational amount of the motor to adjust the position of the substrate during processing.

The foregoing embodiments provide a detection apparatus and method capable of linearly monitoring substrates in situ to a non-linear processing system. In situ inspection minimizes the need for conventional stand-alone inspection platforms comprising dedicated actuating mechanisms such as are routinely used in the art. Further, embodiments of the invention also use to advantage components typically included in any conventional processing system, such as the robot 113. In any case, process monitoring can be performed at various positions in a processing system during normal and necessary operation sequences without transferring the substrates to a separate stand-alone inspection platform, thereby minimizing the impact on throughput. Consequently, each substrate moving through the process system can be inspected, thereby achieving an improvement over prior art systems and processes wherein only periodic sampling was possible due to the negative effect on throughput.

While foregoing is directed to the preferred embodiment of the invention, other and further embodiments of the invention may be devised without departing from the basic scope thereof, and the scope thereof is determined by the claims that follow.

What is claimed is:

1. A processing system, comprising:
    a vacuum transfer chamber;
    a vacuum process chamber coupled to the transfer chamber;
    a robot disposed in the transfer chamber and configured to transfer a substrate between the transfer chamber and the process chamber;
    a sensor positioned to acquire of images of a substrate surface while being moved by the robot; and
    a controller coupled to the sensor, wherein the controller comprises a processor and at least one substrate imaging program containing instructions, that when executed on the processor, causes the processing system to perform a method comprising:
        acquiring, via the sensor, a first image of the substrate while being transported in a first direction at a first velocity by the robot; and
        acquiring, via the sensor, a second image of the substrate while being transported in the first direction at a second velocity by the robot, wherein the first and second images have equal width in the first direction.

2. The system of claim 1, wherein acquiring via the second image further comprises:
    adjusting an exposure time of the sensor between the first and second images.

3. The system of claim 1, wherein the sensor further comprises:
    a transmitter and a receiver.

4. The system of claim 3, wherein the transmitter further comprises:
    a time-domain integration camera, a line camera, a CCD camera, or combinations thereof.

5. The system of claim 3, wherein the receiver further comprises:
    a broad band light source, a narrow band light source, a halogen light source, or combinations thereof.

6. The system of claim 1, wherein the instructions contained by the at least one substrate imaging program, when executed on the processor, causes the processing system to perform the method further comprising:
    acquiring, via the sensor, a third image of the substrate while being transported in the first direction by the robot, wherein a distance between the first, second and third images are equal.

7. The system of claim 6, wherein acquiring the third image further comprises:
    adjusting at least one of a time or distance interval between image acquisitions.

8. The system of claim 6, wherein acquiring the third image further comprises:
    determining a number of motor steps required to move the substrate between image acquisitions.

9. The system of claim 1, wherein the instructions contained by the at least one substrate imaging program, when executed on the processor, causes the processing system to perform the method further comprising:
    acquiring via the sensor a third image of the substrate while being transported in the first direction at a velocity different than at least one of the first or second velocities, wherein a width of the third image in the first direction is equal to the width of the first and second images.

10. A method for acquiring images of a substrate in a vacuum processing system, comprising:
    acquiring, via a sensor, a first image of a substrate being transported in a first direction at a first velocity; and
    acquiring, via the sensor, a second image of the substrate while being transported in the first direction at a second velocity, wherein the first and second images have equal width in the first direction.

11. The method of claim 10, wherein acquiring via the second image further comprises:
    adjusting an exposure time utilized to obtain the second image.

12. The method of claim 10, acquiring via the images further comprises:
    transmitting a beam of energy; and
    reflecting the beam of energy to a receiver.

13. The method of claim 12, wherein the transmitting the beam of energy further comprises:
    generating the beam from a broad band light source, a narrow band light source, a halogen light source, or combinations thereof.

14. The method of claim 10, wherein the acquiring the first image further comprises:
    acquiring the first image using a time-domain integration camera, a line camera, a CCD camera, or combinations thereof.

15. The method of claim 10 further comprising:
    acquiring a third image of the substrate while being transported in the first direction, wherein a distance between the first, second and third images are equal.

16. The method of claim 15, wherein acquiring the third image further comprises:
    adjusting at least one of a time or distance interval between the image acquisitions.

17. The method of claim 15, wherein acquiring the third image further comprises:
    determining a number of motor steps required to move the substrate between the image acquisitions.

18. The method of claim 10 further comprising:
    acquiring via the sensor a third image of the substrate while being transported in the first direction at a velocity different than at least one of the first or second velocities, wherein a width of the third image in the first direction is equal to the width of the first and second images.

19. A method for acquiring images of a substrate in a vacuum processing system, comprising:
    moving a substrate in a first direction in a vacuum processing system; and
    acquiring a plurality of images of the substrate while being transported in the first direction, wherein at least two images are obtained while the substrate is moving a different velocities, wherein the images have equal width in the first direction.

20. The method of claim 19, wherein acquiring the images further comprises:
    timing the acquisition of the images such that a distance between the images are equal.

21. The method of claim 19, wherein acquiring the images further comprises:
    spacing the acquisition of the images such that a distance between the images are equal.

22. The method of claim 21, wherein spacing the images further comprises:
   determining a number of motor steps required to move the substrate between the image acquisitions.

23. The method of claim 21 further comprising:
   analyzing the images to detect particles or aberrations on a surface of the substrate.

* * * * *

UNITED STATES PATENT AND TRADEMARK OFFICE
CERTIFICATE OF CORRECTION

PATENT NO. : 7,969,465 B2  Page 1 of 1
APPLICATION NO. : 11/612717
DATED : June 28, 2011
INVENTOR(S) : Batson et al.

It is certified that error appears in the above-identified patent and that said Letters Patent is hereby corrected as shown below:

In the Background of the Invention:

Column 4, Line 3, please delete "1" and insert --I-- therefor;

In the Detailed Description of the Preferred Embodiment:

Column 8, Line 62, please delete "321" and insert --32I-- therefor;

Column 8, Line 62, please delete "1" and insert --I-- therefor.

Signed and Sealed this
Twenty-seventh Day of September, 2011

David J. Kappos
*Director of the United States Patent and Trademark Office*